(12) United States Patent
Fujikawa et al.

(10) Patent No.: US 8,623,752 B2
(45) Date of Patent: Jan. 7, 2014

(54) OHMIC ELECTRODE FOR SIC SEMICONDUCTOR, METHOD OF MANUFACTURING OHMIC ELECTRODE FOR SIC SEMICONDUCTOR, SEMICONDUCTOR DEVICE, AND METHOD OF MANUFACTURING SEMICONDUCTOR DEVICE

(75) Inventors: Kazuhiro Fujikawa, Osaka (JP); Hideto Tamaso, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 351 days.

(21) Appl. No.: 12/444,537

(22) PCT Filed: Aug. 13, 2007

(86) PCT No.: PCT/JP2007/065816
§ 371 (c)(1),
(2), (4) Date: Apr. 6, 2009

(87) PCT Pub. No.: WO2008/053627
PCT Pub. Date: May 8, 2008

(65) Prior Publication Data
US 2010/0102331 A1    Apr. 29, 2010

(30) Foreign Application Priority Data
Nov. 2, 2006   (JP) .................... 2006-299349

(51) Int. Cl.
*H01L 21/44*    (2006.01)

(52) U.S. Cl.
USPC ........... 438/597; 438/602; 438/652; 438/660; 257/766; 257/E29.143; 257/E21.062

(58) Field of Classification Search
USPC ............ 257/77, 750, 766, E29.143, E29.146, 257/E21.054, E21.062; 438/597, 602, 652, 438/656, 660
See application file for complete search history.

(56) References Cited

U.S. PATENT DOCUMENTS 5,317,190 A * 5/1994 Fleischman et al. .......... 257/743
5,583,379 A * 12/1996 Sato et al. ..................... 257/736

(Continued)

FOREIGN PATENT DOCUMENTS

| JP | 2000-106350 | 4/2000 |
|---|---|---|
| JP | 2003-243323 | 8/2003 |

(Continued)

OTHER PUBLICATIONS

Tsukimoto et al. ("Simultaneous Formation of p- and n-Type Ohmic Contacts to 4H-SiC Using the Ternary Ni/Ti/Al System", J. of Electronic Materials, vol. 34, No. 10, 2005, pp. 1310-1312, (No Month Cited)).*

(Continued)

*Primary Examiner* — Kyoung Lee
*Assistant Examiner* — Ratisha Mehta
(74) *Attorney, Agent, or Firm* — Venable LLP; Michael A. Sartori; Tamatane J. Aga (57) ABSTRACT

An ohmic electrode for SiC semiconductor that contains Si and Ni or an ohmic electrode for SiC semiconductor that further contains Au or Pt in addition to Si and Ni is provided. In addition, a method of manufacturing the ohmic electrode for SiC semiconductor, a semiconductor device including the ohmic electrode for SiC semiconductor, and a method of manufacturing the semiconductor device are provided.

10 Claims, 4 Drawing Sheets

(56) References Cited

U.S. PATENT DOCUMENTS

| | | | |
|---|---|---|---|
| 6,599,644 B1 * | 7/2003 | Zekentes et al. | 428/627 |
| 2002/0024050 A1 * | 2/2002 | Odekirk | 257/77 |
| 2004/0016929 A1 * | 1/2004 | Nakatsuka et al. | 257/77 |
| 2005/0156258 A1 * | 7/2005 | Park et al. | 257/412 |
| 2006/0006393 A1 * | 1/2006 | Ward et al. | 257/77 |
| 2006/0273323 A1 * | 12/2006 | Yamamoto et al. | 257/77 |

FOREIGN PATENT DOCUMENTS

| | | | |
|---|---|---|---|
| JP | 2005-101255 | | 4/2005 |
| JP | 2005-167249 | | 6/2005 |
| JP | 2006-024880 | | 1/2006 |
| JP | 2006-086183 | | 3/2006 |
| JP | 2006/202883 A | | 8/2006 |
| JP | 2006202883 A | * 8/2006 | H01L 21/28 |
| KR | 10-2005-0052926 A | | 6/2005 |
| WO | WO-01/84609 A1 | | 11/2001 |

OTHER PUBLICATIONS

Arai et al., "SiC Sosi no Kiso to Ouyou", Ohmsha, Ltd., pp. 116-118 (Mar. 2003).

Deeb, et al. "A low-temperature route to thermodynamically stable ohmic contacts to $n$-type 6H-SiC", Applied Physics Letters, 84:7, pp. 1117-1119, (2004).

Nakamura, et al. "Schottky barrier height of a new ohmic contact $NiSi_2$ to n-type 6H-SiC", Solid State Electronics, 46, pp. 2063-2067, (2002).

Kakanakova-Georgieva, et al. "Characterization of ohmic and Schottky contacts on SiC", Thin Solid Films, 343-344, pp. 637-641, (1999).

Marinova, et al. "Nickel based ohmic contacts on SiC", Materials Science and Engineering, B46, pp. 223-226, (1997).

Liu, et al. "Improvement of the thermal stability of NiSi films by using a thin Pt interlayer", Applied Physics Letters, 77:14, pp. 2177-2179, (2000).

Office Action in Korean Patent Application No. 10-2009-7007415, dated Nov. 9, 2012.

* cited by examiner

FIG.3

OHMIC ELECTRODE FOR SIC SEMICONDUCTOR, METHOD OF MANUFACTURING OHMIC ELECTRODE FOR SIC SEMICONDUCTOR, SEMICONDUCTOR DEVICE, AND METHOD OF MANUFACTURING SEMICONDUCTOR DEVICE

TECHNICAL FIELD

The present invention relates to an ohmic electrode for SiC (silicon carbide) semiconductor, a method of manufacturing an ohmic electrode for SiC semiconductor, a semiconductor device, and a method of manufacturing a semiconductor device.

BACKGROUND ART

An SiC semiconductor has such characteristics not possessed by an Si (silicon) semiconductor as being greater than the Si semiconductor in a band gap by approximately three times, in a breakdown voltage by approximately ten times, in electron saturation velocity by approximately two times, and in thermal conductivity by approximately three times. Therefore, a semiconductor device such as an electronic device including an SiC semiconductor has been developed in recent years.

In the semiconductor device including the SiC semiconductor, in order for a current to flow in the semiconductor device, an ohmic electrode should be formed on the SiC semiconductor. For example, non-Patent Document 1 ("SiC Sosi no Kiso to Ouyou," co-edited by Kazuo Arai and Sadafumi Yoshida, Ohmsha, Ltd., March 2003, pp. 116 to 118) discloses an electrode composed of Ni (nickel) as an electrode capable of establishing ohmic contact with an n-type SiC semiconductor. In addition, non-Patent Document 1 discloses an electrode formed of a stack of a Ti (titanium) layer and an Al (aluminum) layer (the Al layer being in contact with a p-type SiC semiconductor) as an electrode capable of establishing ohmic contact with a p-type SiC semiconductor. Moreover, non-Patent Document 1 discloses the feature that electrodes can simultaneously be formed on the n-type SiC semiconductor and the p-type SiC semiconductor by using an electrode formed of thin Ni as an electrode capable of establishing ohmic contact with both of the n-type SiC semiconductor and the p-type SiC semiconductor.

Non-Patent Document 1: "SiC Sosi no Kiso to Ouyou," co-edited by Kazuo Arai and Sadafumi Yoshida, Ohmsha, Ltd., March 2003, pp. 116 to 118

DISCLOSURE OF THE INVENTION

Problems to be Solved by the Invention

When an electrode composed of Ni is formed on the SiC semiconductor, however, surface roughness of the electrode occurs. This may be because of aggregation in a reaction layer, of C (carbon) that is eliminated in a process of silicidation through interdiffusion between Ni and Si as a result of heat treatment at the time of formation of the electrode. In addition, in such a case, the SiC semiconductor on which the electrode is formed is eroded.

On the other hand, when the electrode formed of the stack of the Ti layer and the Al layer is formed on the p-type SiC semiconductor region of the semiconductor device including the SiC semiconductor, Al melts in heat treatment at the time of formation of the electrode and adjacent electrodes are short-circuited.

In view of the above-described circumstances, an object of the present invention is to provide an ohmic electrode for SiC semiconductor capable of achieving ohmic contact with both of an n-type SiC semiconductor and a p-type SiC semiconductor, achieving less occurrence of surface roughness of an electrode and achieving less erosion of the SiC semiconductor, a method of manufacturing an ohmic electrode for SiC semiconductor, a semiconductor device including the ohmic electrode for SiC semiconductor, and a method of manufacturing the semiconductor device.

Means for Solving the Problems

The present invention is directed to an ohmic electrode for SiC semiconductor that contains Si and Ni. According to such a feature, ohmic contact with both of an n-type SiC semiconductor and a p-type SiC semiconductor can be established, occurrence of surface roughness of the electrode can be lessened, and erosion of the SiC semiconductor can be lessened. Here, preferably, a ratio between the number of Si atoms and the number of Ni atoms (the number of Si atoms/the number of Ni atoms) in the ohmic electrode for SiC semiconductor according to the present invention is not smaller than 0.9 and not greater than 1.1.

In addition, the present invention is directed to an ohmic electrode for SiC semiconductor that contains Si and Ni as well as Au (gold) or Pt (platinum). According to such a feature as well, ohmic contact with both of an n-type SiC semiconductor and a p-type SiC semiconductor can be established, occurrence of surface roughness of the electrode can be lessened, and erosion of the SiC semiconductor can be lessened. Here, the ohmic electrode for SiC semiconductor according to the present invention may include a mixed layer of Si and Ni formed on an SiC semiconductor, a metal layer implemented by an Au layer or a Pt layer formed on the mixed layer, and an Ni layer formed on the metal layer.

In addition, the present invention is directed to a method of manufacturing an ohmic electrode for SiC semiconductor including the steps of forming an Si layer on an SiC semiconductor, forming an Ni layer on the Si layer, and performing heat treatment of a stack of the Si layer and the Ni layer. According to such a feature, an ohmic electrode for SiC semiconductor capable of establishing ohmic contact with both of an n-type SiC semiconductor and a p-type SiC semiconductor, achieving less occurrence of surface roughness of the electrode, and achieving less erosion of the SiC semiconductor can be manufactured. Here, in the method of manufacturing an ohmic electrode for SiC semiconductor according to the present invention, preferably, a ratio between the number of Si atoms forming the Si layer and the number of Ni atoms forming the Ni layer (the number of Si atoms/the number of Ni atoms) is not smaller than 0.9 and not greater than 1.1.

In addition, the present invention is directed to a method of manufacturing an ohmic electrode for SiC semiconductor including the steps of forming a mixed layer of Si and Ni on an SiC semiconductor and performing heat treatment of the mixed layer. According to such a feature as well, an ohmic electrode for SiC semiconductor capable of establishing ohmic contact with both of an n-type SiC semiconductor and a p-type SiC semiconductor, achieving less occurrence of surface roughness of the electrode, and achieving less erosion of the SiC semiconductor can be manufactured. Here, in the method of manufacturing an ohmic electrode for SiC semiconductor according to the present invention, preferably, a ratio between the number of Si atoms and the number of Ni atoms (the number of Si atoms/the number of Ni atoms) in the mixed layer is not smaller than 0.9 and not greater than 1.1.

In addition, the present invention is directed to a method of manufacturing an ohmic electrode for SiC semiconductor including the steps of forming a first Ni layer on an SiC semiconductor, forming a metal layer implemented by an Au layer or a Pt layer on the first Ni layer, forming a second Ni layer on the metal layer, and performing heat treatment of a stack of the first Ni layer, the metal layer, and the second Ni layer. According to such a feature as well, an ohmic electrode for SiC semiconductor capable of establishing ohmic contact with both of an n-type SiC semiconductor and a p-type SiC semiconductor, achieving less occurrence of surface roughness of the electrode, and achieving less erosion of the SiC semiconductor can be manufactured.

In addition, the present invention is directed to a method of manufacturing an ohmic electrode for SiC semiconductor including the steps of forming an Si layer on an SiC semiconductor, forming a first Ni layer on the Si layer, forming a metal layer implemented by an Au layer or a Pt layer on the first Ni layer, forming a second Ni layer on the metal layer, and performing heat treatment of a stack of the Si layer, the first Ni layer, the metal layer, and the second Ni layer. According to such a feature as well, an ohmic electrode for SiC semiconductor capable of establishing ohmic contact with both of an n-type SiC semiconductor and a p-type SiC semiconductor, achieving less occurrence of surface roughness of the electrode, and achieving less erosion of the SiC semiconductor can be manufactured. Here, in the method of manufacturing an ohmic electrode for SiC semiconductor according to the present invention, preferably, a ratio between the number of Si atoms forming the Si layer and the number of Ni atoms forming the first Ni layer (the number of Si atoms/the number of Ni atoms) is not smaller than 0.9 and not greater than 1.1.

In addition, the present invention is directed to a method of manufacturing an ohmic electrode for SiC semiconductor including the steps of forming a mixed layer of Si and Ni on an SiC semiconductor, forming a metal layer implemented by an Au layer or a Pt layer on the mixed layer, forming an Ni layer on the metal layer, and performing heat treatment of a stack of the mixed layer, the metal layer, and the Ni layer. According to such a feature as well, an ohmic electrode for SiC semiconductor capable of establishing ohmic contact with both of an n-type SiC semiconductor and a p-type SiC semiconductor, achieving less occurrence of surface roughness of the electrode, and achieving less erosion of the SiC semiconductor can be manufactured. Here, in the method of manufacturing an ohmic electrode for SiC semiconductor according to the present invention, preferably, a ratio between the number of Si atoms and the number of Ni atoms (the number of Si atoms/the number of Ni atoms) in the mixed layer is not smaller than 0.9 and not greater than 1.1.

In addition, the present invention is directed to a semiconductor device having a p-type SiC semiconductor region and an n-type SiC semiconductor region, in which the ohmic electrode for SiC semiconductor above is formed on the p-type SiC semiconductor region and the ohmic electrode for SiC semiconductor above is formed on the n-type SiC semiconductor region. In the semiconductor device with such a feature, ohmic contact with both of an n-type SiC semiconductor and a p-type SiC semiconductor can be established, occurrence of surface roughness of the electrode can be lessened, and erosion of the SiC semiconductor can be lessened. Moreover, electrodes establishing ohmic contact with the p-type SiC semiconductor region and the n-type SiC semiconductor region respectively can simultaneously be formed.

Further, the present invention is directed to a method of manufacturing a semiconductor device in which formation of the ohmic electrode for SiC semiconductor above on a p-type SiC semiconductor region and formation of the ohmic electrode for SiC semiconductor above on an n-type SiC semiconductor region are simultaneously performed. According to such a feature, a semiconductor device capable of establishing ohmic contact with both of an n-type SiC semiconductor and a p-type SiC semiconductor, achieving less occurrence of surface roughness of the electrode, and achieving less erosion of the SiC semiconductor can be manufactured, and electrodes establishing ohmic contact with the p-type SiC semiconductor region and the n-type SiC semiconductor region respectively can simultaneously be formed.

EFFECTS OF THE INVENTION

According to the present invention, an ohmic electrode for SiC semiconductor capable of establishing ohmic contact with both of an n-type SiC semiconductor and a p-type SiC semiconductor, achieving less occurrence of surface roughness of an electrode and achieving less erosion of the SiC semiconductor, a method of manufacturing an ohmic electrode for SiC semiconductor, a semiconductor device including the ohmic electrode for SiC semiconductor, and a method of manufacturing the semiconductor device can be provided.

DESCRIPTION OF THE REFERENCE SIGNS

1 SiC semiconductor; 2 ohmic electrode for SiC semiconductor; 3 Si layer; 4 Ni layer; 4a first Ni layer; 4b second Ni layer; 5 Au layer; and 6 mixed layer.

BEST MODES FOR CARRYING OUT THE INVENTION

An embodiment of the present invention will be described hereinafter. In the drawings of the present invention, the same or corresponding elements have the same reference characters allotted.

(First Embodiment)

Figure 1:
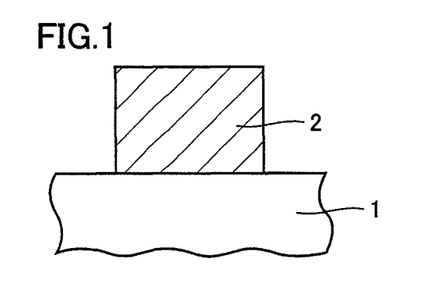
FIG. 1 is a schematic cross-sectional view of a preferred example of an ohmic electrode for SiC semiconductor according to the present invention.

FIG. 1 is a schematic cross-sectional view of a preferred example of an ohmic electrode for SiC semiconductor according to the present invention. An ohmic electrode 2 for SiC semiconductor is formed on an SiC semiconductor 1, and ohmic electrode 2 for SiC semiconductor establishes ohmic contact with SiC semiconductor 1. In the present invention, a conductivity type of SiC semiconductor 1 may be any of n-type and p-type.

Figure 2:
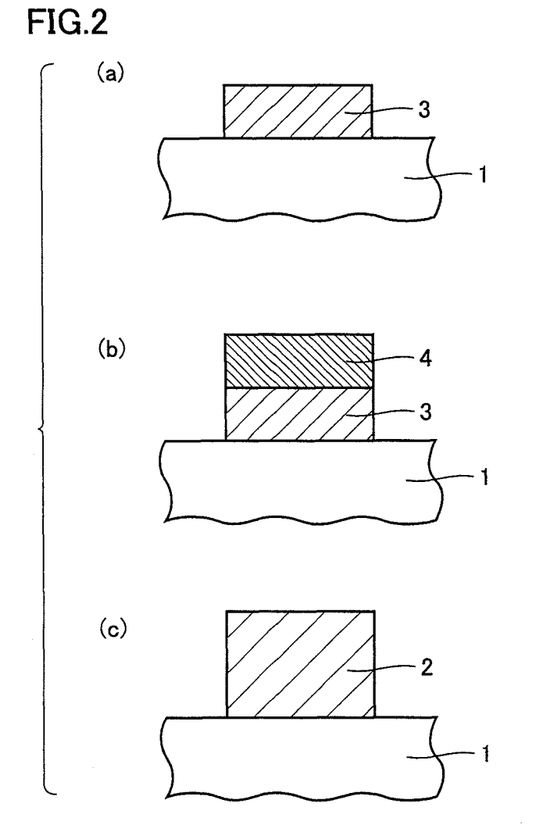
FIG. 2 is a schematic cross-sectional view illustrating a preferred example of a method of manufacturing the ohmic electrode for SiC semiconductor according to the present invention.

A preferred example of a method of manufacturing the ohmic electrode for SiC semiconductor according to the present invention will be described hereinafter with reference to schematic cross-sectional views in FIGS. 2(a) to 2(c). Initially, as shown in FIG. 2(a), an Si layer 3 is formed on SiC semiconductor 1. It is noted that Si layer 3 can be formed with a conventionally known method such as a vapor deposition method or a sputtering method.

Thereafter, as shown in FIG. 2(b), an Ni layer 4 is formed on Si layer 3. It is noted that Ni layer 4 can be formed with a conventionally known method such as a vapor deposition method or a sputtering method.

Thereafter, a stack of Si layer 3 and Ni layer 4 is subjected to heat treatment through heating. As a result of heat treatment, silicidation of the stack of Si layer 3 and Ni layer 4 is achieved, and ohmic electrode 2 for SiC semiconductor that contains Si and Ni as shown in FIG. 2(c) is formed. Here, silicidation refers to formation of an alloy of Si and a metal other than Si.

Here, a ratio between the number of Si atoms forming Si layer 3 and the number of Ni atoms forming Ni layer 4 (the number of Si atoms/the number of Ni atoms) is preferably not smaller than 0.9 and not greater than 1.1 and more preferably not smaller than 0.95 and not greater than 1.05. If the ratio between the number of Si atoms forming Si layer 3 and the number of Ni atoms forming Ni layer 4 (the number of Si atoms/the number of Ni atoms) is smaller than 0.9, SiC semiconductor 1 may be eroded in the heat treatment above. If the ratio is greater than 1.1, a part of Si layer 3 may remain without reacting, after the heat treatment above.

In addition, if the ratio between the number of Si atoms forming Si layer 3 and the number of Ni atoms forming Ni layer 4 (the number of Si atoms/the number of Ni atoms) is not smaller than 0.95 and not greater than 1.05, it is likely that homogeneous ohmic electrode 2 for SiC semiconductor, in which Si and Ni are dispersed more uniformly as a whole, can be formed, without erosion of SiC semiconductor 1 through the heat treatment above.

In addition, a ratio between the number of Si atoms and the number of Ni atoms (the number of Si atoms/the number of Ni atoms) in ohmic electrode 2 for SiC semiconductor is preferably not smaller than 0.9 and not greater than 1.1 and more preferably not smaller than 0.95 and not greater than 1.05. If the ratio between the number of Si atoms and the number of Ni atoms (the number of Si atoms/the number of Ni atoms) in ohmic electrode 2 for SiC semiconductor is smaller than 0.9, ohmic electrode 2 for SiC semiconductor may be formed of an inhomogeneous alloy layer composed of several types of silicides. If the ratio is greater than 1.1, ohmic electrode 2 for SiC semiconductor may be formed of an inhomogeneous alloy layer composed of silicide and Si that has not reacted.

In addition, if the ratio between the number of Si atoms and the number of Ni atoms (the number of Si atoms/the number of Ni atoms) in ohmic electrode 2 for SiC semiconductor is not smaller than 0.95 and not greater than 1.05, it is likely that homogeneous ohmic electrode 2 for SiC semiconductor, in which Si and Ni are dispersed more uniformly as a whole, can be formed.

In addition, if the ratio between the number of Si atoms and the number of Ni atoms (the number of Si atoms/the number of Ni atoms) in ohmic electrode 2 for SiC semiconductor is not smaller than 0.9 and not greater than 1.1 and particularly not smaller than 0.95 and not greater than 1.05, it is likely that surface roughness of ohmic electrode 2 for SiC semiconductor lessens. Therefore, contact resistance between the surface of ohmic electrode 2 for SiC semiconductor and an interconnection metal layer formed on that surface tends to be lower and adhesion strength between ohmic electrode 2 for SiC semiconductor and the interconnection metal layer tends to increase.

In addition, the total thickness of Si layer 3 and Ni layer 4 is preferably not smaller than 50 nm and not greater than 100 nm. If the total thickness of Si layer 3 and Ni layer 4 is smaller than 50 nm, ohmic electrode 2 for SiC semiconductor to be formed may not cover an entire electrode formation region. If the total thickness of Si layer 3 and Ni layer 4 exceeds 100 nm, a resistance of ohmic electrode 2 for SiC semiconductor may become higher.

In addition, a temperature for heat treatment of the stack of Si layer 3 and Ni layer 4 is preferably not lower than 900° C. and more preferably not lower than 950° C. If the temperature for heat treatment of the stack of Si layer 3 and Ni layer 4 is lower than 900° C., silicidation at the time of formation of ohmic electrode 2 for SiC semiconductor may be insufficient. If the temperature for heat treatment of the stack of Si layer 3 and Ni layer 4 is not lower than 950° C., silicidation at the time of formation of ohmic electrode 2 for SiC semiconductor tends to be sufficient.

In addition, the temperature for heat treatment of the stack of Si layer 3 and Ni layer 4 is preferably not higher than 1100° C. and more preferably not higher than 1050° C. If the temperature for heat treatment of the stack of Si layer 3 and Ni layer 4 is higher than 1100° C., ohmic electrode 2 for SiC semiconductor may be damaged. If the temperature for heat treatment of the stack of Si layer 3 and Ni layer 4 is not higher than 1050° C., it is likely that damage of ohmic electrode 2 for SiC semiconductor can be mitigated.

In addition, a time period for heat treatment of the stack of Si layer 3 and Ni layer 4 is preferably not shorter than 1 minute and not longer than 5 minutes. If the time period for heat treatment of the stack of Si layer 3 and Ni layer 4 is shorter than 1 minute, silicidation at the time of formation of ohmic electrode 2 for SiC semiconductor may be insufficient. If the time period for heat treatment of the stack of Si layer 3 and Ni layer 4 exceeds 5 minutes, ohmic electrode 2 for SiC semiconductor may be damaged.

Ohmic electrode 2 for SiC semiconductor thus obtained can establish ohmic contact with both of the n-type SiC semiconductor and the p-type SiC semiconductor, achieve less occurrence of surface roughness of the electrode, and achieve less erosion of SiC semiconductor 1.

In the description above, ohmic electrode 2 for SiC semiconductor is formed by performing heat treatment after Si layer 3 and Ni layer 4 are stacked. In the present invention, however, ohmic electrode 2 for SiC semiconductor containing Si and Ni may also be formed in such a manner that, after a mixed layer of Si and Ni is formed with a method of simultaneously sputtering a target composed of Si and a target composed of Ni, the mixed layer is subjected to heat treatment, to thereby achieve silicidation of the mixed layer.

In addition, a thickness of the mixed layer above is preferably not smaller than 50 nm and not greater than 100 nm. If the thickness of the mixed layer above is smaller than 50 nm, ohmic electrode 2 for SiC semiconductor to be formed may not cover the entire electrode formation region. If the thickness exceeds 100 nm, a resistance of ohmic electrode 2 for SiC semiconductor may become higher.

In addition, a ratio between the number of Si atoms and the number of Ni atoms (the number of Si atoms/the number of Ni atoms) in the mixed layer above is preferably not smaller than 0.9 and not greater than 1.1 and more preferably not smaller than 0.95 and not greater than 1.05. If the ratio between the number of Si atoms and the number of Ni atoms (the number of Si atoms/the number of Ni atoms) in the mixed layer above is smaller than 0.9, ohmic electrode 2 for SiC semiconductor may be formed of an inhomogeneous alloy layer composed of several types of silicides. If the ratio is greater than 1.1, ohmic electrode 2 for SiC semiconductor may be formed of an inhomogeneous alloy layer composed of silicide and Si that has not reacted.

In addition, if the ratio between the number of Si atoms and the number of Ni atoms (the number of Si atoms/the number of Ni atoms) in the mixed layer above is not smaller than 0.95 and not greater than 1.05, it is likely that homogeneous ohmic electrode 2 for SiC semiconductor, in which Si and Ni are dispersed more uniformly as a whole, can be formed.

In addition, if the ratio between the number of Si atoms and the number of Ni atoms (the number of Si atoms/the number of Ni atoms) in the mixed layer above is not smaller than 0.9 and not greater than 1.1 and particularly not smaller than 0.95 and not greater than 1.05, it is likely that surface roughness of ohmic electrode 2 for SiC semiconductor lessens. Therefore, contact resistance between the surface of ohmic electrode 2 for SiC semiconductor and an interconnection metal layer formed on that surface tends to be lower and adhesion strength between ohmic electrode 2 for SiC semiconductor and the interconnection metal layer tends to increase.

In addition, a temperature for heat treatment of the mixed layer above is preferably not lower than 900° C. and more preferably not lower than 950° C. If the temperature for heat treatment of the mixed layer above is lower than 900° C., silicidation at the time of formation of ohmic electrode 2 for SiC semiconductor may be insufficient. If the temperature for heat treatment of the mixed layer above is not lower than 950° C., silicidation at the time of formation of ohmic electrode 2 for SiC semiconductor tends to be sufficient.

In addition, the temperature for heat treatment of the mixed layer above is preferably not higher than 1100° C. and more preferably not higher than 1050° C. If the temperature for heat treatment of the mixed layer above is higher than 1100° C., ohmic electrode 2 for SiC semiconductor may be damaged. If the temperature for heat treatment of the mixed layer above is not higher than 1050° C., it is likely that damage of ohmic electrode 2 for SiC semiconductor can be mitigated.

In addition, a time period for heat treatment of the mixed layer above is preferably not shorter than 1 minute and not longer than 5 minutes. If the time period for heat treatment of the mixed layer above is shorter than 1 minute, silicidation at the time of formation of ohmic electrode 2 for SiC semiconductor may be insufficient. If the time period for heat treatment of the mixed layer above exceeds 5 minutes, ohmic electrode 2 for SiC semiconductor may be damaged.

(Second Embodiment)

Figure 3:
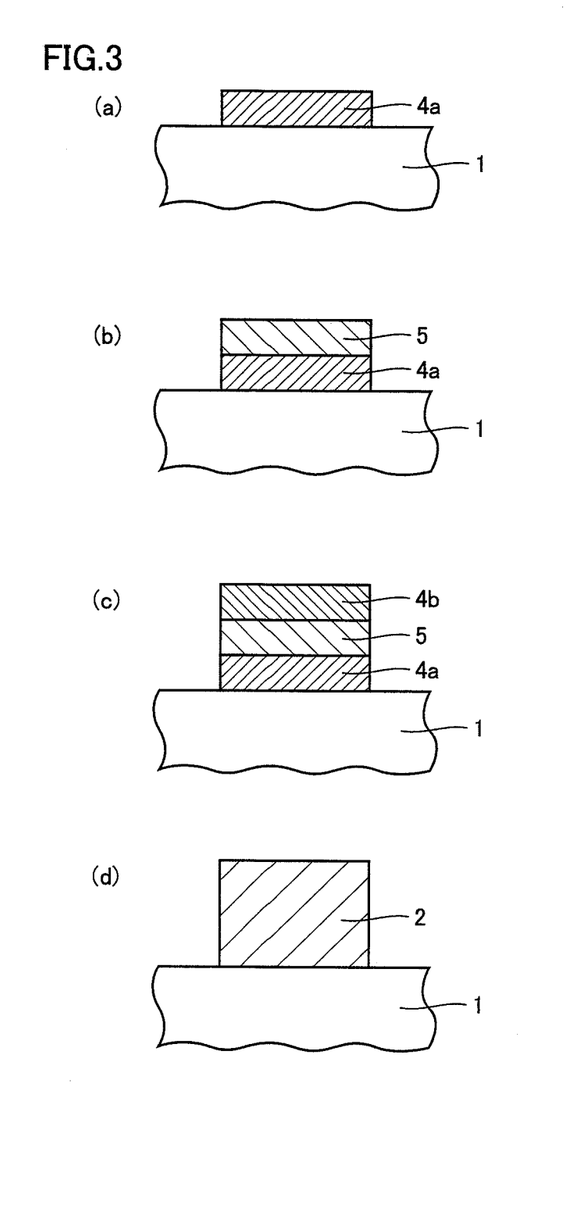
FIG. 3 is a schematic cross-sectional view illustrating another preferred example of a method of manufacturing the ohmic electrode for SiC semiconductor according to the present invention.

Another preferred example of a method of manufacturing an ohmic electrode for SiC semiconductor according to the present invention will be described hereinafter with reference to schematic cross-sectional views in FIGS. 3(a) to 3(d).

Initially, as shown in FIG. 3(a), a first Ni layer 4a is formed on SiC semiconductor 1. It is noted that first Ni layer 4a can be formed with a conventionally known method such as a vapor deposition method or a sputtering method.

Thereafter, as shown in FIG. 3(b), an Au layer 5 is formed on first Ni layer 4a. It is noted that Au layer 5 can be formed with a conventionally known method such as a vapor deposition method or a sputtering method.

In succession, as shown in FIG. 3(c), a second Ni layer 4b is formed on Au layer 5. Here, second Ni layer 4b can be formed with a conventionally known method such as a vapor deposition method or a sputtering method.

Thereafter, a stack of first Ni layer 4a, Au layer 5, and second Ni layer 4b is subjected to heat treatment through heating. As a result of heat treatment, ohmic electrode 2 for SiC semiconductor that contains Si and Ni as well as Au as shown in FIG. 3(d) is formed.

Through the heat treatment above, Si diffuses from SiC semiconductor 1 into first Ni layer 4a in contact with SiC semiconductor 1 and silicidation of first Ni layer 4a is achieved, whereas Au layer 5 does not experience silicidation. Therefore, by forming Au layer 5, silicidation of first Ni layer 4a in contact with SiC semiconductor 1 can readily be controlled.

Here, a thickness of second Ni layer 4b is preferably not smaller than 50 nm and not greater than 100 nm. If the thickness of second Ni layer 4b is smaller than 50 nm, ohmic electrode 2 for SiC semiconductor to be formed may not cover the entire electrode formation region. If the thickness exceeds 100 nm, a resistance of ohmic electrode 2 for SiC semiconductor may become higher.

In addition, a thickness of Au layer 5 is preferably not smaller than 20 nm and not greater than 30 nm. If the thickness of Au layer 5 is smaller than 20 nm, Si is transmitted through Au layer 5 and diffuses into second Ni layer 4b, which may result in silicidation of second Ni layer 4b. If the thickness exceeds 30 nm, a resistance of ohmic electrode 2 for SiC semiconductor to be formed may be higher.

In addition, a temperature for heat treatment of the stack of first Ni layer 4a, Au layer 5 and second Ni layer 4b is preferably not lower than 900° C. and more preferably not lower than 950° C. If the temperature for heat treatment of the stack of first Ni layer 4a, Au layer 5 and second Ni layer 4b is lower than 900° C., silicidation at the time of formation of ohmic electrode 2 for SiC semiconductor may be insufficient. If the temperature for heat treatment of the stack of first Ni layer 4a, Au layer 5, and second Ni layer 4b is not lower than 950° C., silicidation at the time of formation of ohmic electrode 2 for SiC semiconductor tends to be sufficient.

In addition, the temperature for heat treatment of the stack of first Ni layer 4a, Au layer 5 and second Ni layer 4b is preferably not higher than 1100° C. and more preferably not higher than 1050° C. If the temperature for heat treatment of the stack of first Ni layer 4a, Au layer 5 and second Ni layer 4b is higher than 1100° C., ohmic electrode 2 for SiC semiconductor may be damaged. If the temperature for heat treatment of the stack of first Ni layer 4a, Au layer 5 and second Ni layer 4b is not higher than 1050° C., it is likely that damage of ohmic electrode 2 for SiC semiconductor can be mitigated.

In addition, a time period for heat treatment of the stack of first Ni layer 4a, Au layer 5 and second Ni layer 4b is preferably not shorter than 1 minute and not longer than 5 minutes. If the time period for heat treatment of the stack of first Ni layer 4a, Au layer 5 and second Ni layer 4b is shorter than 1 minute, silicidation at the time of formation of ohmic electrode 2 for SiC semiconductor may be insufficient. If the time period for heat treatment of the stack of first Ni layer 4a, Au layer 5 and second Ni layer 4b exceeds 5 minutes, ohmic electrode 2 for SiC semiconductor may be damaged.

Ohmic electrode 2 for SiC semiconductor thus obtained can establish ohmic contact with both of the n-type SiC semiconductor and the p-type SiC semiconductor, achieve less occurrence of surface roughness of the electrode, and achieve less erosion of SiC semiconductor 1.

Though Au layer 5 is formed in the description above, a Pt layer may be formed instead of Au layer 5 in the present invention, because the Pt layer does not experience silicidation as in the case of Au layer 5. Here, a thickness of the Pt layer is preferably not smaller than 20 nm and not greater than 30 nm, for the reasons the same as in the case of Au layer 5.

(Third Embodiment)

Figure 4:
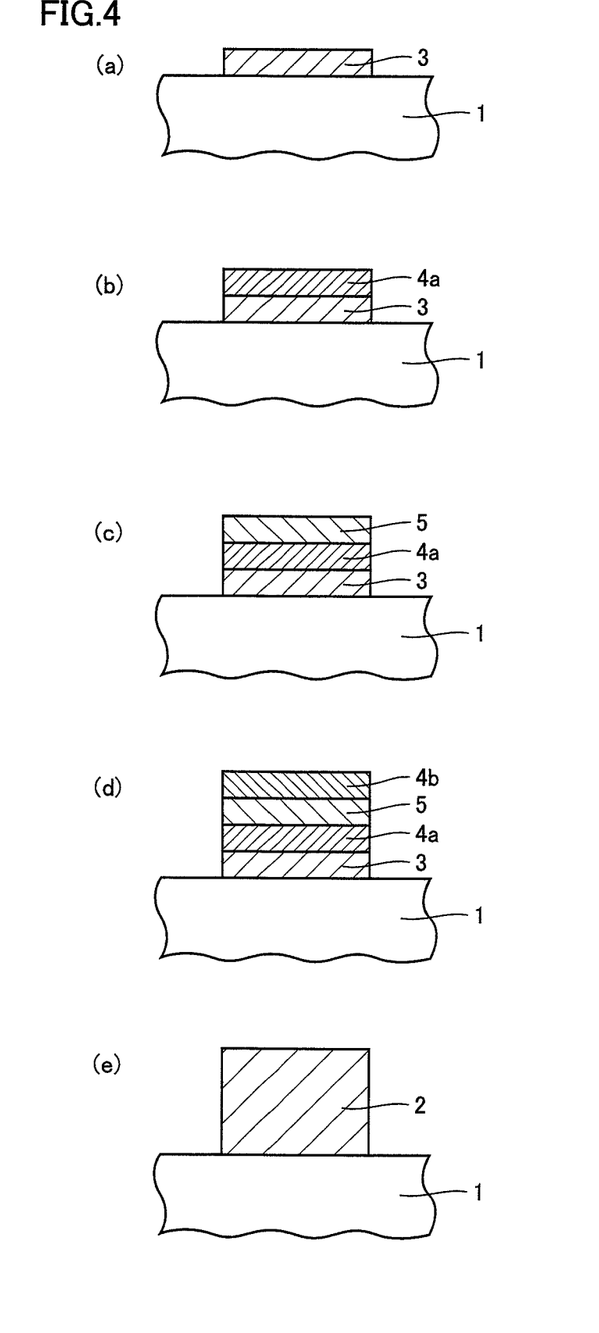
FIG. 4 is a schematic cross-sectional view illustrating another preferred example of a method of manufacturing the ohmic electrode for SiC semiconductor according to the present invention.

Another preferred example of a method of manufacturing an ohmic electrode for SiC semiconductor according to the present invention will be described hereinafter with reference to schematic cross-sectional views in FIGS. 4(a) to 4(e).

Initially, as shown in FIG. 4(a), Si layer 3 is formed on SiC semiconductor 1. Thereafter, as shown in FIG. 4(b), first Ni layer 4a is formed on Si layer 3.

Thereafter, as shown in FIG. 4(c), Au layer 5 is formed on first Ni layer 4a. In succession, as shown in FIG. 4(d), second Ni layer 4b is formed on Au layer 5.

Thereafter, a stack of Si layer 3, first Ni layer 4a, Au layer 5, and second Ni layer 4b is subjected to heat treatment through heating. As a result of heat treatment, ohmic electrode 2 for SiC semiconductor that contains Si and Ni as well as Au as shown in FIG. 4(e) is formed.

Ohmic electrode 2 for SiC semiconductor thus obtained can establish ohmic contact with both of the n-type SiC semiconductor and the p-type SiC semiconductor, achieve less occurrence of surface roughness of the electrode, and achieve less erosion of SiC semiconductor 1.

Here, through the heat treatment above, Si diffuses from Si layer 3 in contact with SiC semiconductor 1 and silicidation of Si layer 3 and first Ni layer 4a is achieved, whereas Au layer 5 does not experience silicidation. Therefore, by forming Au layer 5, silicidation of Si layer 3 in contact with SiC semiconductor 1 and first Ni layer 4a can readily be controlled.

In addition, a temperature for heat treatment of the stack of Si layer 3, first Ni layer 4a, Au layer 5, and second Ni layer 4b is preferably not lower than 900° C. and more preferably not lower than 950° C. If the temperature for heat treatment of the stack of Si layer 3, first Ni layer 4a, Au layer 5, and second Ni layer 4b is lower than 900° C., silicidation at the time of formation of ohmic electrode 2 for SiC semiconductor may be insufficient. If the temperature for heat treatment of the stack of Si layer 3, first Ni layer 4a, Au layer 5, and second Ni layer 4b is not lower than 950° C., silicidation at the time of formation of ohmic electrode 2 for SiC semiconductor tends to be sufficient.

In addition, the temperature for heat treatment of the stack of Si layer 3, first Ni layer 4a, Au layer 5, and second Ni layer 4b is preferably not higher than 1100° C. and more preferably not higher than 1050° C. If the temperature for heat treatment of the stack of Si layer 3, first Ni layer 4a, Au layer 5, and second Ni layer 4b is higher than 1100° C., ohmic electrode 2 for SiC semiconductor may be damaged. If the temperature for heat treatment of the stack of Si layer 3, first Ni layer 4a, Au layer 5, and second Ni layer 4b is not higher than 1050° C., it is likely that damage of ohmic electrode 2 for SiC semiconductor can be mitigated.

In addition, a time period for heat treatment of the stack of Si layer 3, first Ni layer 4a, Au layer 5, and second Ni layer 4b is preferably not shorter than 1 minute and not longer than 5 minutes. If the time period for heat treatment of the stack of Si layer 3, first Ni layer 4a, Au layer 5, and second Ni layer 4b is shorter than 1 minute, silicidation at the time of formation of ohmic electrode 2 for SIC semiconductor may be insufficient. If the time period for heat treatment of the stack of Si layer 3, first Ni layer 4a, Au layer 5, and second Ni layer 4b exceeds 5 minutes, ohmic electrode 2 for SiC semiconductor may be damaged.

The description is otherwise the same as in the first embodiment and the second embodiment.

(Fourth Embodiment)

Figure 5:
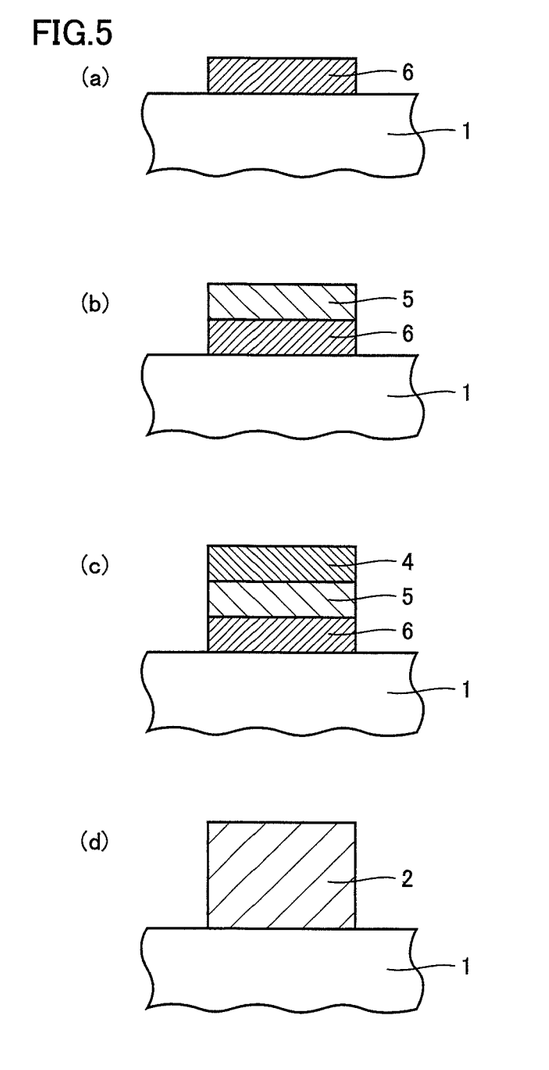
FIG. 5 is a schematic cross-sectional view illustrating another preferred example of a method of manufacturing the ohmic electrode for SiC semiconductor according to the present invention.

Another preferred example of a method of manufacturing an ohmic electrode for SiC semiconductor according to the present invention will be described hereinafter with reference to schematic cross-sectional views in FIGS. 5(a) to 5(d).

Initially, as shown in FIG. 5(a), a mixed layer 6 of Si and Ni is formed on SiC semiconductor 1, for example, with a method of simultaneously sputtering a target composed of Si and a target composed of Ni.

Here, a ratio between the number of Si atoms and the number of Ni atoms (the number of Si atoms/the number of Ni atoms) in mixed layer 6 above is preferably not smaller than 0.9 and not greater than 1.1 and more preferably not smaller than 0.95 and not greater than 1.05, for the reasons the same as described in the first embodiment above.

Thereafter, as shown in FIG. 5(b), Au layer 5 is formed on mixed layer 6. Thereafter, as shown in FIG. 5(c), Ni layer 4 is formed on Au layer 5.

Thereafter, a stack of mixed layer 6, Au layer 5, and Ni layer 4 is subjected to heat treatment through heating. As a result of heat treatment, silicidation of the mixed layer of Si and Ni is achieved and ohmic electrode 2 for SiC semiconductor including the mixed layer of Si and Ni, the Au layer, and the Ni layer as shown in FIG. 5(d) is formed.

In addition, a temperature for heat treatment of the stack of mixed layer 6, Au layer 5 and Ni layer 4 is preferably not lower than 900° C. and more preferably not lower than 950° C. If the temperature for heat treatment of the stack of mixed layer 6, Au layer 5 and Ni layer 4 is lower than 900° C., silicidation at the time of formation of ohmic electrode 2 for SiC semiconductor may be insufficient. If the temperature for heat treatment of the stack of mixed layer 6, Au layer 5 and Ni layer 4 is not lower than 950° C., silicidation at the time of formation of ohmic electrode 2 for SiC semiconductor tends to be sufficient.

In addition, the temperature for heat treatment of the stack of mixed layer 6, Au layer 5 and Ni layer 4 is preferably not higher than 1100° C. and more preferably not higher than 1050° C. If the temperature for heat treatment of the stack of mixed layer 6, Au layer 5 and Ni layer 4 is higher than 1100° C., ohmic electrode 2 for SiC semiconductor may be damaged. If the temperature for heat treatment of the stack of mixed layer 6, Au layer 5 and Ni layer 4 is not higher than 1050° C., it is likely that damage of ohmic electrode 2 for SiC semiconductor can be mitigated.

In addition, a time period for heat treatment of the stack of mixed layer 6, Au layer 5 and Ni layer 4 is preferably not shorter than 1 minute and not longer than 5 minutes. If the time period for heat treatment of the stack of mixed layer 6, Au layer 5 and Ni layer 4 is shorter than 1 minute, silicidation at the time of formation of ohmic electrode 2 for SiC semiconductor may be insufficient. If the time period for heat treatment of the stack of mixed layer 6, Au layer 5 and Ni layer 4 exceeds 5 minutes, ohmic electrode 2 for SiC semiconductor may be damaged.

Ohmic electrode 2 for SiC semiconductor thus obtained can establish ohmic contact with both of the n-type SiC semiconductor and the p-type SiC semiconductor, achieve less occurrence of surface roughness of the electrode, and achieve less erosion of SiC semiconductor 1.

The description is otherwise the same as in the first embodiment, the second embodiment, and the third embodiment.

(Semiconductor Device)

The ohmic electrode for SiC semiconductor according to the present invention obtained as above can suitably be used for a semiconductor device having a p-type SiC semiconductor region and an n-type SiC semiconductor region.

Namely, the ohmic electrode for SiC semiconductor according to the present invention establishes ohmic contact with each of the p-type SiC semiconductor region and the n-type SiC semiconductor region. Therefore, the step of forming an electrode can be simplified by simultaneously forming the ohmic electrode for SiC semiconductor according to the present invention in each of the p-type SiC semiconductor region and the n-type SiC semiconductor region after the p-type SiC semiconductor region and the n-type SiC semiconductor region are exposed in the steps of manufacturing the semiconductor device above.

Examples of such a semiconductor device according to the present invention include a junction field effect transistor, an MOS field effect transistor, a bipolar transistor, or the like.

EXAMPLES

Example 1

An SiC semiconductor obtained by epitaxially growing an n-type 4H—SiC semiconductor layer to a thickness of 2 μm on a 4H—SiC semiconductor substrate having 2-inch diameter and an SiC semiconductor obtained by epitaxially growing a p-type 4H—SiC semiconductor layer to a thickness of 2 μm on the same were prepared as the SiC semiconductors. Here, the n-type 4H—SiC semiconductor layer was doped with nitrogen representing an n-type impurity, and the concentration of the n-type impurity in the n-type 4H—SiC semiconductor layer was set to $1.4 \times 10^{19}$ cm$^{-3}$. In addition, the p-type 4H—SiC semiconductor layer was doped with aluminum representing a p-type impurity, and the concentration of the p-type impurity in the p-type 4H—SiC semiconductor layer was set to $5.0 \times 10^{18}$ cm$^{-3}$.

After respective surfaces of the n-type 4H—SiC semiconductor layer and the p-type 4H—SiC semiconductor layer above were cleaned, using photolithography, a resist pattern exposing a part of the surface of the SiC semiconductor layer was formed on the surface of each of these SiC semiconductor layers.

Thereafter, the Si layer was formed to a thickness of 48 nm with a sputtering method on the surface of each of the n-type 4H—SiC semiconductor layer and the p-type 4H—SiC semiconductor layer.

Thereafter, the Ni layer was formed on the Si layer to a thickness of 26 nm with a sputtering method. Here, as to an Si layer and an Ni layer separately formed with the method and conditions the same as those for the Si layer and the Ni layer above, a ratio between the number of Si atoms forming the Si layer and the number of Ni atoms forming the Ni layer was determined with Auger electron spectroscopy. As a result, it was confirmed that, in any of the Si layer and the Ni layer formed on the surface of the n-type 4H—SiC semiconductor layer and the Si layer and the Ni layer formed on the surface of the p-type 4H—SiC semiconductor substrate, the ratio between the number of Si atoms forming the Si layer and the number of Ni atoms forming the Ni layer (the number of Si atoms/the number of Ni atoms) was 1.02.

Thereafter, the resist pattern was removed with lift-off, to form the patterned stack of the Si layer and the Ni layer on the surface of each of the n-type 4H—SiC semiconductor layer and the p-type 4H—SiC semiconductor layer.

Thereafter, the 4H—SiC semiconductor substrate having the n-type 4H—SiC semiconductor layer on which the stack of the Si layer and the Ni layer was formed and the 4H—SiC semiconductor substrate having the p-type 4H—SiC semiconductor layer on which the stack of the Si layer and the Ni layer was formed were introduced in a chamber, where heat treatment was performed in such a manner that heating was performed in an argon atmosphere at 1000° C. for 2 minutes. Thus, the electrode according to Example 1 containing Si and Ni was formed on the surface of each of the n-type 4H—SiC semiconductor layer and the p-type 4H—SiC semiconductor layer.

The electrode according to Example 1 thus formed was visually observed. Then, surface roughness of the electrode according to Example 1 formed on the surface of the n-type 4H—SiC semiconductor layer and surface roughness of the electrode according to Example 1 formed on the surface of the p-type 4H—SiC semiconductor layer as well as erosion of the n-type 4H—SiC semiconductor layer and erosion of the p-type 4H—SiC semiconductor layer were not observed.

In addition, by feeding a current across the adjacent electrodes according to Example 1, current-voltage characteristics of the electrodes according to Example 1 formed on the respective surfaces of the n-type 4H—SiC semiconductor layer and the p-type 4H—SiC semiconductor layer were measured. As a result, it was confirmed that both of the electrode according to Example 1 formed on the surface of the n-type 4H—SiC semiconductor layer and the electrode according to Example 1 formed on the surface of the p-type 4H—SiC semiconductor layer exhibited ohmic characteristics.

A composition of the electrode according to Example 1 separately fabricated with the method and conditions the same as above was analyzed using Auger electron spectroscopy. Then, it was confirmed that a ratio between the number of Si atoms and the number of Ni atoms (the number of Si atoms/the number of Ni atoms) in the electrode according to Example 1 was 1.01.

Example 2

A 4H—SiC semiconductor substrate having the n-type 4H—SiC semiconductor layer and a 4H—SiC semiconductor substrate having the p-type 4H—SiC semiconductor layer, on which the resist pattern the same as in Example 1 was formed, were fabricated as in Example 1.

Thereafter, the mixed layer of Si and Ni was formed to a thickness of 80 nm on the surface of each of the n-type 4H—SiC semiconductor layer and the p-type 4H—SiC semiconductor layer, by simultaneously sputtering a target composed of Si and a target composed of Ni. Here, a ratio between the number of Si atoms and the number of Ni atoms in a mixed layer, that had separately been formed with the method and the conditions the same as those for this mixed layer, was determined with Auger electron spectroscopy. As a result, it was confirmed that, in any of the mixed layer formed on the surface of the n-type 4H—SiC semiconductor layer and the mixed layer formed on the surface of the p-type 4H—SiC semiconductor layer, the ratio between the number of Si atoms and the number of Ni atoms (the number of Si atoms/the number of Ni atoms) in the mixed layer was 1.03.

Thereafter, the resist pattern was removed with lift-off, to form the patterned mixed layer containing Si and Ni on the surface of each of the n-type 4H—SiC semiconductor layer and the p-type 4H—SiC semiconductor layer.

Thereafter, the 4H—SiC semiconductor substrate having the n-type 4H—SiC semiconductor layer and the 4H—SiC semiconductor substrate having the p-type 4H—SiC semiconductor layer, on which the mixed layer containing Si and Ni was formed, were introduced in a chamber, where heat treatment was performed in such a manner that heating was performed in an argon atmosphere at 1000° C. for 2 minutes. Thus, the electrode according to Example 2 containing Si and Ni was formed on the surface of each of the n-type 4H—SiC semiconductor layer and the p-type 4H—SiC semiconductor layer.

The electrode according to Example 2 fabricated as above was visually observed under the criteria the same as in Example 1. Then, surface roughness of the electrode according to Example 2 formed on the surface of the n-type 4H—SiC semiconductor layer and surface roughness of the electrode according to Example 2 formed on the surface of the p-type 4H—SiC semiconductor layer as well as erosion of the n-type 4H—SiC semiconductor layer and erosion of the p-type 4H—SiC semiconductor layer were not observed.

In addition, by feeding a current across the adjacent electrodes according to Example 2, current-voltage characteristics of the electrodes according to Example 2 formed on the respective surfaces of the n-type 4H—SiC semiconductor layer and the p-type 4H—SiC semiconductor layer were measured. As a result, it was confirmed that both of the electrode according to Example 2 formed on the surface of the n-type 4H—SiC semiconductor layer and the electrode according to Example 2 formed on the surface of the p-type 4H—SiC semiconductor layer exhibited ohmic characteristics.

A composition of the electrode according to Example 2 separately fabricated with the method and conditions the same as above was analyzed using Auger electron spectroscopy. Then, it was confirmed that a ratio between the number of Si atoms and the number of Ni atoms (the number of Si atoms/the number of Ni atoms) in the electrode according to Example 2 was 1.02.

Example 3

A 4H—SiC semiconductor substrate having the n-type 4H—SiC semiconductor layer and a 4H—SiC semiconductor substrate having the p-type 4H—SiC semiconductor layer, on which the resist pattern the same as in Example 1 was formed, were fabricated as in Example 1.

Then, the first Ni layer was formed to a thickness of 50 nm with a vacuum vapor deposition method on the surface of each of the n-type 4H—SiC semiconductor layer and the p-type 4H—SiC semiconductor layer. Thereafter, the Au layer was formed on the first Ni layer to a thickness of 30 nm with a vacuum vapor deposition method. Thereafter, the second Ni layer was formed on the Au layer to a thickness of 50 nm with a vacuum vapor deposition method.

Thereafter, the resist pattern was removed with lift-off, to form the patterned stack including the first Ni layer, the Au layer and the second Ni layer on the surface of each of the n-type 4H—SiC semiconductor layer and the p-type 4H—SiC semiconductor layer.

Thereafter, the 4H—SiC semiconductor substrate having the n-type 4H—SiC semiconductor layer and the 4H—SiC semiconductor substrate having the p-type 4H—SiC semiconductor layer, on which the stack including the first Ni layer, the Au layer and the second Ni layer was formed, were introduced in a chamber, where heat treatment was performed in such a manner that heating was performed in an argon atmosphere at 1000° C. for 2 minutes. Thus, the electrode according to Example 3 containing Si and Ni as well as Au was formed on the surface of each of the n-type 4H—SiC semiconductor layer and the p-type 4H—SiC semiconductor layer.

The electrode according to Example 3 fabricated as above was visually observed under the criteria the same as in Example 1. Then, surface roughness of the electrode according to Example 3 formed on the surface of the n-type 4H—SiC semiconductor layer and surface roughness of the electrode according to Example 3 formed on the surface of the p-type 4H—SiC semiconductor layer as well as erosion of the n-type 4H—SiC semiconductor layer and erosion of the p-type 4H—SiC semiconductor layer were not observed.

In addition, by feeding a current across the adjacent electrodes according to Example 3, current-voltage characteristics of the electrodes according to Example 3 formed on the respective surfaces of the n-type 4H—SiC semiconductor layer and the p-type 4H—SiC semiconductor layer were measured. As a result, it was confirmed that both of the electrode according to Example 3 formed on the surface of the n-type 4H—SiC semiconductor layer and the electrode according to Example 3 formed on the surface of the p-type 4H—SiC semiconductor layer exhibited ohmic characteristics.

Example 4

A 4H—SiC semiconductor substrate having the n-type 4H—SiC semiconductor layer and a 4H—SiC semiconductor substrate having the p-type 4H—SiC semiconductor layer, on which the resist pattern the same as in Example 1 was formed, were fabricated as in Example 1.

Thereafter, the Si layer was formed to a thickness of 48 nm with a sputtering method on the surface of each of the n-type 4H—SiC semiconductor layer and the p-type 4H—SiC semiconductor layer.

Thereafter, the first Ni layer was formed on the Si layer to a thickness of 26 nm with a sputtering method. Here, a ratio between the number of Si atoms and the number of Ni atoms in an Si layer and a first Ni layer respectively, that had separately been formed with the method and the conditions the same as those for the Si layer and the first Ni layer above, was determined with Auger electron spectroscopy. As a result, it was confirmed that, in any of the Si layer and the first Ni layer formed on the surface of the n-type 4H—SiC semiconductor layer and the Si layer and the first Ni layer formed on the surface of the p-type 4H—SiC semiconductor layer, the ratio between the number of Si atoms forming the Si layer and the number of Ni atoms forming the first Ni layer (the number of Si atoms/the number of Ni atoms) was 1.02.

In succession, the Au layer was formed on the first Ni layer to a thickness of 30 nm with a vacuum vapor deposition method. Thereafter, the second Ni layer was formed on the Au layer to a thickness of 50 nm with a vacuum vapor deposition method.

Thereafter, the resist pattern was removed with lift-off, to form the patterned stack including the Si layer, the first Ni layer, the Au layer, and the second Ni layer on the surface of each of the n-type 4H—SiC semiconductor layer and the p-type 4H—SiC semiconductor layer.

Thereafter, the 4H—SiC semiconductor substrate having the n-type 4H—SiC semiconductor layer and the 4H—SiC semiconductor substrate having the p-type 4H—SiC semiconductor layer, on which the stack including the Si layer, the first Ni layer, the Au layer, and the second Ni layer was formed, were introduced in a chamber, where heat treatment was performed in such a manner that heating was performed in an argon atmosphere at 1000° C. for 2 minutes. Thus, the electrode according to Example 4 containing Si and Ni as well as Au was formed on the surface of each of the n-type 4H—SiC semiconductor layer and the p-type 4H—SiC semiconductor layer.

The electrode according to Example 4 fabricated as above was visually observed under the criteria the same as in Example 1. Then, surface roughness of the electrode according to Example 4 formed on the surface of the n-type 4H—SiC semiconductor layer and surface roughness of the electrode according to Example 4 formed on the surface of the p-type 4H—SiC semiconductor layer as well as erosion of the n-type 4H—SiC semiconductor layer and erosion of the p-type 4H—SiC semiconductor layer were not observed.

In addition, by feeding a current across the adjacent electrodes according to Example 4, current-voltage characteristics of the electrodes according to Example 4 formed on the respective surfaces of the n-type 4H—SiC semiconductor layer and the p-type 4H—SiC semiconductor layer were measured. As a result, it was confirmed that both of the electrode according to Example 4 formed on the surface of the n-type 4H—SiC semiconductor layer and the electrode according to Example 4 formed on the surface of the p-type 4H—SiC semiconductor layer exhibited ohmic characteristics.

Example 5

A 4H—SiC semiconductor substrate having the n-type 4H—SiC semiconductor layer and a 4H—SiC semiconductor substrate having the p-type 4H—SiC semiconductor layer, on which the resist pattern the same as in Example 1 was formed, were fabricated as in Example 1.

Thereafter, the mixed layer of Si and Ni was formed to a thickness of 80 nm on the surface of each of the n-type 4H—SiC semiconductor layer and the p-type 4H—SiC semiconductor layer, by simultaneously sputtering a target composed of Si and a target composed of Ni. Here, a ratio between the number of Si atoms and the number of Ni atoms in a mixed layer, that had separately been formed with the method and the conditions the same as those for this mixed layer, was determined with Auger electron spectroscopy. As a result, it was confirmed that, in any of the mixed layer formed on the surface of the n-type 4H—SiC semiconductor layer and the mixed layer formed on the surface of the p-type 4H—SiC semiconductor layer, the ratio between the number of Si atoms and the number of Ni atoms (the number of Si atoms/the number of Ni atoms) in the mixed layer was 1.03.

In succession, the Au layer was formed on the mixed layer above to a thickness of 30 nm with a vacuum vapor deposition method. Thereafter, the Ni layer was formed on the Au layer to a thickness of 50 nm with a vacuum vapor deposition method.

Thereafter, the resist pattern was removed with lift-off, to form the patterned stack including the mixed layer above, the Au layer, and the Ni layer on the surface of each of the n-type 4H—SiC semiconductor layer and the p-type 4H—SiC semiconductor layer.

Thereafter, the 4H—SiC semiconductor substrate having the n-type 4H—SiC semiconductor layer on which the stack including the mixed layer above, the Au layer, and the Ni layer was formed and the 4H—SiC semiconductor substrate having the p-type 4H—SiC semiconductor layer on which the stack including the mixed layer above, the Au layer, and the Ni layer was formed were introduced in a chamber, where heat treatment was performed in such a manner that heating was performed in an argon atmosphere at 1000° C. for 2 minutes. Thus, the electrode according to Example 5 containing Si and Ni as well Au was formed on the surface of each of the n-type 4H—SiC semiconductor layer and the p-type 4H—SiC semiconductor layer.

The electrode according to Example 5 fabricated as above was visually observed under the criteria the same as in Example 1. Then, surface roughness of the electrode according to Example 5 formed on the surface of the n-type 4H—SiC semiconductor layer and surface roughness of the electrode according to Example 5 formed on the surface of the p-type 4H—SiC semiconductor layer as well as erosion of the n-type 4H—SiC semiconductor layer and erosion of the p-type 4H—SiC semiconductor layer were not observed.

In addition, by feeding a current across the adjacent electrodes according to Example 5, current-voltage characteristics of the electrodes according to Example 5 formed on the respective surfaces of the n-type 4H—SiC semiconductor layer and the p-type 4H—SiC semiconductor layer were measured. As a result, it was confirmed that both of the electrode according to Example 5 formed on the surface of the n-type 4H—SiC semiconductor layer and the electrode according to Example 5 formed on the surface of the p-type 4H—SiC semiconductor layer exhibited ohmic characteristics.

Comparative Example 1

A 4H—SiC semiconductor substrate having the n-type 4H—SiC semiconductor layer and a 4H—SiC semiconductor substrate having the p-type 4H—SiC semiconductor layer, on which the resist pattern the same as in Example 1 was formed, were fabricated as in Example 1.

Then, the Ni layer was formed to a thickness of 100 nm with a vacuum vapor deposition method on the surface of each of the n-type 4H—SiC semiconductor layer and the p-type 4H—SiC semiconductor layer.

Thereafter, the resist pattern was removed with lift-off, to form the patterned Ni layer on the surface of each of the n-type 4H—SiC semiconductor layer and the p-type 4H—SiC semiconductor layer.

Thereafter, the n-type 4H—SiC semiconductor layer and the p-type 4H—SiC semiconductor layer, on which the Ni layer above was formed, were introduced in a chamber, where heat treatment was performed in such a manner that heating was performed in an argon atmosphere at 1000° C. for 2 minutes. Thus, the electrode according to Comparative Example 1 containing Ni was formed on the surface of each of the n-type 4H—SiC semiconductor layer and the p-type 4H—SiC semiconductor layer.

The electrode according to Comparative Example 1 fabricated as above was visually observed under the criteria the same as in Example 1. Then, it was confirmed that the surface of the electrode according to Comparative Example 1 formed on the surface of the n-type 4H—SiC semiconductor layer and the surface of the electrode according to Comparative Example 1 formed on the surface of the p-type 4H—SiC semiconductor layer were significantly rougher than the surfaces of the electrodes according to Examples 1 to 5.

In addition, it was also confirmed that both of the n-type 4H—SiC semiconductor layer and the p-type 4H—SiC semiconductor layer, on which the electrode according to Comparative Example 1 was formed, were eroded.

Therefore, it was confirmed that the electrodes according to Examples 1 to 5 establish ohmic electrode with the SiC semiconductor, and can achieve less occurrence of the surface roughness of the electrode and less erosion of the SiC semiconductor as compared with the conventional electrode.

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

Industrial Applicability

According to the present invention, an ohmic electrode for SiC semiconductor capable of establishing ohmic contact with both of an n-type SiC semiconductor and a p-type SiC semiconductor, achieving less occurrence of surface roughness of an electrode and achieving less erosion of the SiC semiconductor, a method of manufacturing an ohmic electrode for SiC semiconductor, a semiconductor device including the ohmic electrode for SiC semiconductor, and a method of manufacturing the semiconductor device can be provided.

The invention claimed is:

1. The ohmic electrode for SiC semiconductor, comprising:
   a mixed layer of Si and Ni formed on an SiC semiconductor;
   a metal layer implemented by an Au layer or a Pt layer formed on said mixed layer; and
   an Ni layer formed on said metal layer, wherein said mixed layer of Si and Ni is in direct physical contact with said SiC semiconductor.

2. A semiconductor device having a p-type SiC semiconductor region and an n-type SiC semiconductor region, characterized in that the ohmic electrode for SiC semiconductor according to claim 1 is formed on said p-type SiC semiconductor region and the ohmic electrode for SiC semiconductor according to claim 1 is formed on said n-type SiC semiconductor region.

3. A method of manufacturing a semiconductor device, characterized in that formation of the ohmic electrode for SiC semiconductor according to claim 1 on a p-type SiC semiconductor region and formation of the ohmic electrode for SiC semiconductor according to claim 4 on an n-type SiC semiconductor region are simultaneously performed.

4. A method of manufacturing an ohmic electrode for SiC semiconductor, comprising the steps of:
   forming an Si layer on an SiC semiconductor to come in direct physical contact with said SiC semiconductor; and
   performing heat treatment of said mixed layer.

5. The method of manufacturing an ohmic electrode for SiC semiconductor according to claim 4, wherein
   a ratio between number of Si atoms and number of Ni atoms (number of Si atoms/number of Ni atoms) in said mixed layer is not smaller than 0.9 and not greater than 1.1.

6. A method of manufacturing an ohmic electrode for SiC semiconductor, comprising the steps of:
   forming a first Ni layer on an SiC semiconductor to come in direct physical contact with said SiC semiconductor;
   forming a metal layer implemented by an Au layer or a Pt layer on said first Ni layer;
   forming a second Ni layer on said metal layer; and
   performing heat treatment of a stack of said first Ni layer, said metal layer, and said second Ni layer.

7. A method of manufacturing an ohmic electrode for SiC semiconductor, comprising the steps of:
   forming an Si layer on an SiC semiconductor;
   forming a first Ni layer on said Si layer;
   forming a metal layer implemented by an Au layer or a Pt layer on said first Ni layer;
   forming a second Ni layer on said metal layer; and
   performing heat treatment of a stack of said Si layer, said first Ni layer, said metal layer, and said second Ni layer.

8. The method of manufacturing an ohmic electrode for SiC semiconductor according to claim 7, wherein
   a ratio between number of Si atoms forming said Si layer and number of Ni atoms forming said first Ni layer (number of Si atoms/number of Ni atoms) is not smaller than 0.9 and not greater than 1.1.

9. A method of manufacturing an ohmic electrode for SiC semiconductor, comprising the steps of:
   forming a mixed layer of Si and Ni on an SiC semiconductor;
   forming a metal layer implemented by an Au layer or a Pt layer on said mixed layer;
   forming an Ni layer on said metal layer; and
   performing heat treatment of a stack of said mixed layer, said metal layer, and said Ni layer.

10. The method of manufacturing an ohmic electrode for SiC semiconductor according to claim 9, wherein
    a ratio between number of Si atoms and number of Ni atoms (number of Si atoms/number of Ni atoms) in said mixed layer is not smaller than 0.9 and not greater than 1.1.

* * * * *

UNITED STATES PATENT AND TRADEMARK OFFICE
CERTIFICATE OF CORRECTION

PATENT NO.        : 8,623,752 B2
APPLICATION NO.   : 12/444537
DATED             : January 7, 2014
INVENTOR(S)       : Fujikawa et al.

It is certified that error appears in the above-identified patent and that said Letters Patent is hereby corrected as shown below:

In the claims:

1. In claim 3, column 17, in line 39, "SiC semiconductor according to claim 4" should be --SiC semiconductor according to claim 1--.

2. In claim 4, column 17, in line 43, "forming an Si layer on an SiC semiconductor" should be --forming a mixed layer of Si and Ni on an SiC semiconductor--.

Signed and Sealed this
Second Day of September, 2014

Michelle K. Lee
*Deputy Director of the United States Patent and Trademark Office*